United States Patent [19]
Albares et al.

[11] Patent Number: 5,987,045
[45] Date of Patent: Nov. 16, 1999

[54] HIGH POWER NARROW PULSE LASER DIODE CIRCUIT

[75] Inventors: Donald J. Albares; Ching T. Chang; Chen-Kuo Sun; Everett W. Jacobs, all of San Diego, Calif.

[73] Assignee: The United States of America as represented by the Secretary of the Navy, Washington, D.C.

[21] Appl. No.: 08/829,996

[22] Filed: Apr. 2, 1997

[51] Int. Cl.⁶ .................................................. H07S 3/10
[52] U.S. Cl. ............................................................ 372/38
[58] Field of Search ........................................ 372/38, 25

[56] References Cited

U.S. PATENT DOCUMENTS

| | | | |
|---|---|---|---|
| 4,764,930 | 8/1988 | Bille et al. | 372/23 |
| 4,813,048 | 3/1989 | Yamane et al. | 372/38 |
| 4,864,577 | 9/1989 | Aoshima | 372/18 |
| 4,928,248 | 5/1990 | Takahashi et al. | 372/348 |
| 4,972,423 | 11/1990 | Alfano et al. | 372/25 |
| 5,128,601 | 7/1992 | Orbach et al. | 372/30 |
| 5,128,950 | 7/1992 | Tsuchiya et al. | 372/25 |
| 5,151,911 | 9/1992 | Bi et al. | 372/32 |
| 5,181,213 | 1/1993 | Shinokura et al. | 372/30 |
| 5,220,572 | 6/1993 | Kawaguchi | 372/30 |
| 5,235,606 | 8/1993 | Mourou et al. | 372/25 |
| 5,265,107 | 11/1993 | Delfyett, Jr. | 372/11 |
| 5,272,708 | 12/1993 | Esterowitz et al. | 372/20 |
| 5,293,397 | 3/1994 | Veligdan | 372/25 |

OTHER PUBLICATIONS

"High–Energy (59 pJ) and Low–Jitter (250 fs) Picosecond Pulses from Gain–Switching of a Tapered–Stripe Laser Diode via Resonant Driving," IEE Photonics Technology Letters, vol. 8, No. 9 Sep. 1996, C.T. Chang et al.

*Primary Examiner*—James W. Davie
*Attorney, Agent, or Firm*—Harvey Fendelman; Michael A. Kagan; Eric James Whitesell

[57] ABSTRACT

A resonant driving circuit for a laser diode comprises an impulse generator for generating narrow output pulses, a delay line for generating a composite output of reflections of the output pulses from terminations of the transmission line, a laser diode for generating an optical output from the composite output, and a forward bias network to bias the laser diode.

17 Claims, 2 Drawing Sheets

HIGH POWER NARROW PULSE LASER DIODE CIRCUIT

BACKGROUND OF THE INVENTION

The present invention relates to pulsed laser diodes. More specifically, but without limitation thereto, the present invention relates to driving a laser diode with a resonant electrical circuit formed by an impedance mismatch at each end of a transmission line connecting an impulse generator to the laser diode.

High energy optical pulses are widely used in applications such as optical fiber communications, optoelectronic sampling, optical clocking of logic circuits, and photonic switching. The generation of picosecond optical pulses at high pulse repetition frequencies from laser diodes has received much interest in recent years because the laser diodes are much smaller, less expensive, more reliable, and more efficient than gas lasers, and because of the variety of applications in optical signal processing and optical fiber communication systems. The majority of research in this area has centered on using active optical mode locking schemes. These schemes employ electrical modulation and utilize an optical resonant cavity, generally an external resonant cavity, although more sophisticated setups utilize a monolithic cavity structure. Passive optical mode locking schemes have also been studied. These schemes typically use a saturable absorber which results in a device that self resonates. Some of the drawbacks of these optical mode locking schemes are their complexity, and their sensitivity to mechanical vibration. Methods utilizing gain switching have also been studied. These methods have the advantage of being simple, but with the drawbacks of longer pulse width, less optical pulse power, and smaller on-off ratio than mode locking schemes.

Both mode-locking and gain-switching are commonly used to generate pulses having pulse widths in the picosecond range. The limitation on mode-locking of conventional laser diodes having a typical cavity length in the 300 $\mu$m range is low pulse energy. The pulse energy of these laser diodes is approximately 1 pJ, although high energy pulses of about 50 pJ before compression were reported recently by A. Azouz et al from mode-locking a laser diode having a 2000 $\mu$m cavity (A. Azouz, N. Stelmakh, P. Langlois, J-M Lourtioz, and P. Gavrilovic, "Nonlinear Chirp Compensation in High-power Broad-spectrum Pulses from Single-stripe Mode-locked Laser Diodes", IEEE Journal of Selected Topics in Quantum Electronics, vol. 1, pp. 577–582, 1995). However, mode-locking suffers from the complexity of an external cavity. Compared to mode-locking, gain-switching is simpler, more compact, and more reliable for generating high energy pulses having a duration in the range of about 10 picoseconds. Current gain-switching techniques, however, suffer the disadvantages of longer pulse widths, lower optical power, and a smaller on-off ratio than mode-locking provides. A need thus continues to exist for a circuit for driving laser diodes that combines the advantages of gain-switching and mode-locking in an inexpensive, compact, reliable laser diode circuit to produce optical pulses having a narrow pulse width, high energy, low jitter, and high extinction ratio.

SUMMARY OF THE INVENTION

A resonant driving circuit for a laser diode of the present invention is directed to overcoming the problems described above, and may provide further related advantages. No embodiment of the present invention described herein shall preclude other embodiments or advantages that may exist or become obvious to those skilled in the art.

A resonant driving circuit for a laser diode of the present invention comprises an impulse generator for generating narrow output pulses, a delay line for generating a composite output of reflections of the output pulses from terminations of the transmission line, a laser diode for generating an optical output from the composite output, and a forward bias network to bias the laser diode.

Two advantages of the resonant driving circuit of the present invention are that optical pulses may be generated having high power and narrow pulse width.

Another advantage is that optical pulses may be generated that have low phase jitter.

Yet another advantage is that a higher on-off ratio may be obtained than with presently available gain-switched circuits.

Other advantages are that the resonant driving circuit of the present invention is simple, reliable, and inexpensive.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1:
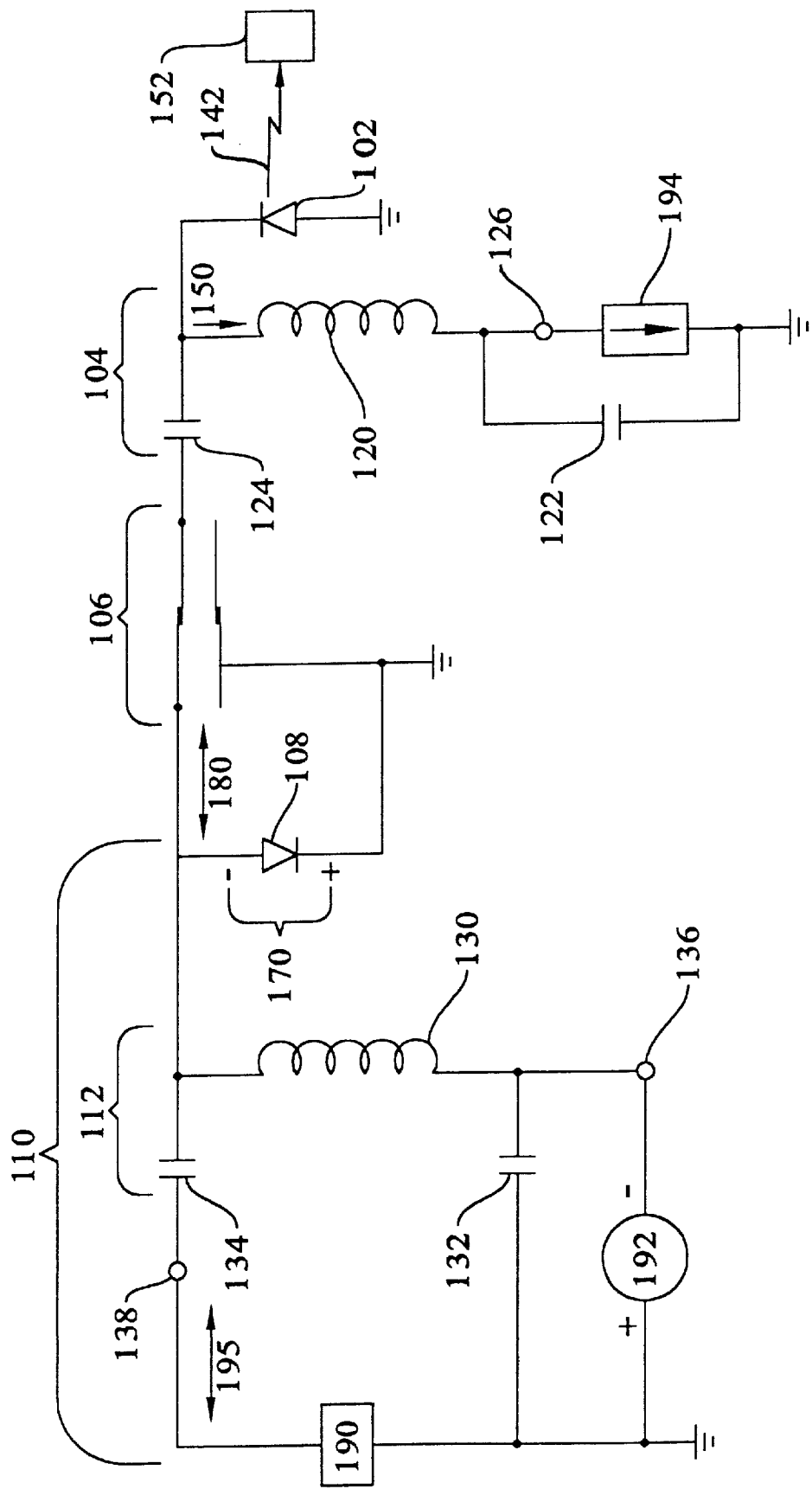
FIG. 1 is an electrical schematic of a gain-switched laser diode circuit of the present invention.

In FIG. 1 a resonant driving circuit 10 comprises a laser diode 102, a forward bias network 104, a delay line 106, and an impulse generator 110. Impulse generator 110 comprises a drive signal source 190, a step recovery diode 108, and a reverse bias network 112 to bias step recovery diode 108. Laser diode 102 may be, for example, a GaAlAs gain-guided, tapered stripe laser available commercially as Sony part no. 202V-3. The Sony 202V-3 has a typical threshold current of 80 mA, a length of about 250 $\mu$m, and supports stable single-mode near field and single-lobe far field patterns at 50 mw of cw optical power output.

Forward bias network 104 may be, for example, a DC blocking capacitor 124, an RF choke 120 and an RF bypass capacitor 122. A forward bias current 150 of, by way of example, 118 mA may be introduced into bias network 104 at forward bias input 126 by a current source 194 to bias laser diode 102 well above the laser threshold current, thereby minimizing the power required from drive signal 195. DC blocking capacitor 124 isolates step recovery diode 108 from forward bias current 150. RF choke 120 and RF bypass capacitor 122 isolate forward bias input 126 from drive signal 180.

Reverse bias network 112 may be, for example, a DC blocking capacitor 134, an RF choke 130, and an RF bypass capacitor 132. A reverse bias voltage 170 of, for example, 1.1 V may be applied to step recovery diode 108 at reverse bias input 136 by a voltage source 192. DC blocking capacitor 134 isolates drive signal input 138 from reverse bias voltage 170. RF choke 130 and RF bypass capacitor 132 isolate reverse bias input 136 from drive signal 195.

Drive signal 195 may be, for example, a sine wave having a frequency of about 1.2 GHz and a power level of about 1.1W generated by a drive signal source 190. Impulse generator 110 may be implemented, for example, by a Hewlett-Packard 2645A drive signal source 190, a Hewlett-Packard 33005C step recovery diode 108, and a biasing network 112 providing an appropriate DC voltage 170 to present an output impedance of about 30 ohms.

Delay line 106 may be, for example, a variable length of 50 ohm transmission line. If laser diode 102 is biased to present an input impedance of about 4 ohms, the circuit between step recovery diode output 180 and laser diode 102 may be approximated as a 50-ohm transmission line terminated by a short circuit at each end. According to basic transmission line theory, the reflection of a pulse traveling down a transmission line will be inverted if the transmission line is terminated by a short circuit. This principle may be used to create a resonant cavity as follows. If a pulse output from impulse generator 110 is inverted upon reflection at laser diode 102 and inverted again upon reflection at impulse generator 110, the time delay of delay line 106 may be adjusted to cause the reflected pulses to constructively interfere with pulses in step recovery diode output 180, thereby increasing the peak power and minimizing pulse spreading. The time delay of delay line 106 may be adjusted according to the formula $fp=V/2L$, where $fp$ is the desired pulse repetition frequency, $v$ is the velocity of the pulse in delay line 106, and $L$ is the length of delay line 106. The pulse width may be varied by adjusting the DC bias current to the HP 33005C impulse generator.

Figure 2A:
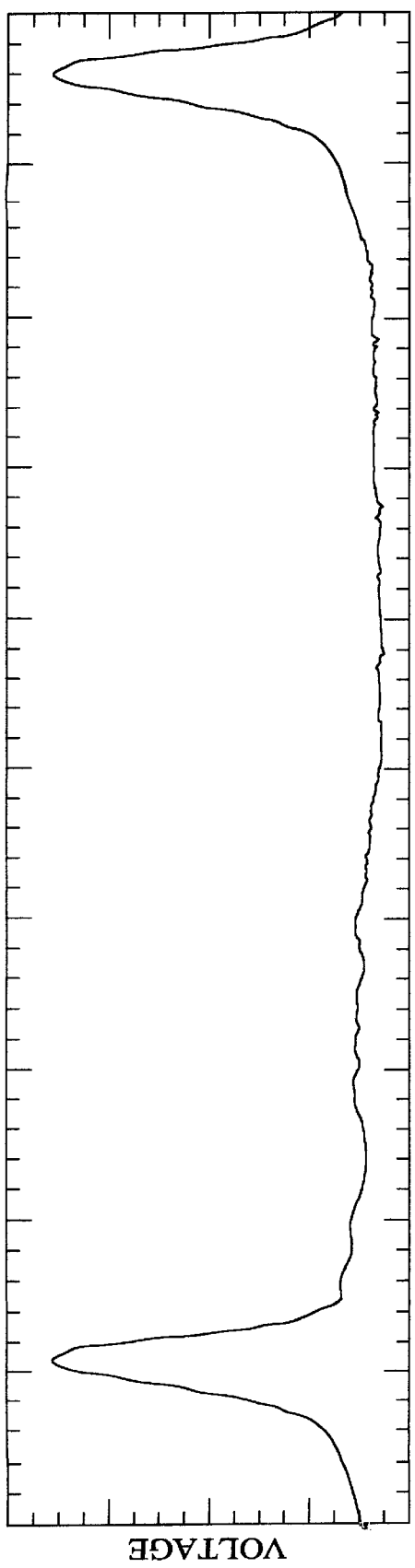
FIG. 2A is an oscilloscope trace of the drive signal pulses measured at the output of the step recovery diode.
Figure 2B:
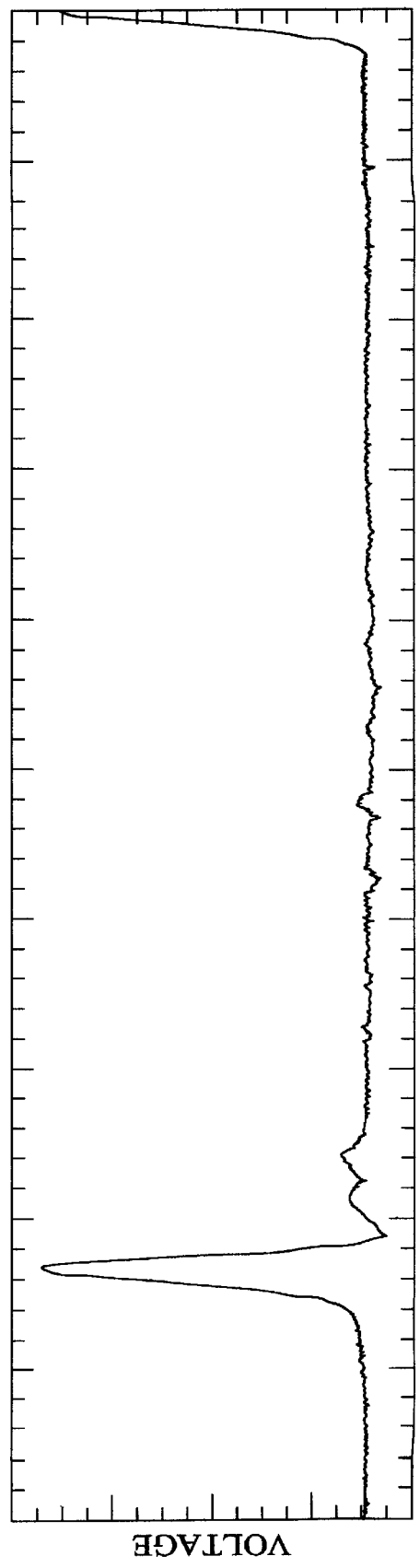
FIG. 2B is an oscilloscope trace of the response of a Schottky photodiode to the optical output of the laser diode.

FIG. 2A is an oscilloscope trace of a typical drive signal pulse measured at the output of step recovery diode 108. FIG. 2B is an oscilloscope trace of the response of a Schottky photodiode to the optical output of laser diode 102. Typical circuit performance results are an optical energy pulse of 59 pJ, an extinction (on-off) ratio of 800, a phase jitter of 250 fs, and a Full Width at Half Maximum (FWHM) of 14.5 ps. This is believed to be the highest energy reported for a short (250 $\mu$m) single stripe laser diode and is comparable to that of a 2000 $\mu$m laser diode. These unusual results are believed to be attributable to the stable single-mode near field pattern, single-lobe far field pattern, and multi-longitudinal modes associated with the tapered stripe laser diode under high driving current pulses. The current pulses are believed to be enhanced by electrical resonance resulting from the reflection at the impedance mismatch between laser diode 102 in FIG. 1 and delay line 106, and the reflection at the impedance mismatch between delay line 106 and impulse generator 110. The resonance may be optimized by adjusting the length of delay line 106.

Light output 142 emitted by laser diode 102 may be coupled into an optical device 152 for use in other applications. Examples of optical devices 152 are optical focusing systems, optical communications systems, optoelectronic sampling circuits, optoelectronic logic clocking circuits, optoelectronic multiplexers, and photonic switches, which may include optical fibers, photodiodes and other optoelectronic coupling devices.

Other modifications, variations, and applications of the present invention may be made in accordance with the above teachings other than as specifically described to practice the invention within the scope of the following claims.

We claim:
1. A resonant driving circuit for a laser diode comprising:
an impulse generator for generating electrical pulses;
a delay line coupled to said impulse generator for increasing peak power of said electrical pulses;
a laser diode coupled in series when delay line for producing optical pulses in response to said electrical pulses; and
a forward bias network coupled to said laser diode.
2. The resonant driving circuit of claim 1 wherein said impulse generator comprises:
a drive signal source;
a step recovery diode coupled to said drive signal source; and
a reverse bias network coupled to said step recovery diode.
3. The resonant driving circuit of claim 2 wherein said drive signal source comprises an RF signal generator coupled to said step recovery diode.
4. The resonant driving circuit of claim 2 wherein said drive signal source outputs a sine wave having a frequency of about 1.2 GHz and a power level of about 1.1W.
5. The resonant driving circuit of claim 2 further comprising a voltage source coupled to said reverse bias network.
6. The resonant driving circuit of claim 2 wherein said reverse bias network comprises:
a DC blocking capacitor coupled to said signal drive source;
an RF choke coupled to said DC blocking capacitor;
and an RF bypass capacitor coupled to said RF choke.
7. The resonant driving circuit of claim 1 further comprising a current source coupled to said forward bias network.
8. The resonant driving circuit of claim 1 wherein said forward bias network comprises:
a DC blocking capacitor coupled to said delay line;
an RF choke coupled to said DC blocking capacitor; and
an RF bypass capacitor coupled to said RF choke.
9. The resonant driving circuit of claim 1 wherein said laser diode is a GaAlAs gain-guided, tapered stripe laser having a threshold current of about 80 mA and a length of about 250 $\mu$m.
10. The resonant driving circuit of claim 1 wherein said delay line comprises a length of transmission line.
11. The resonant driving circuit of claim 10 wherein said transmission line has a variable length.
12. The resonant driving circuit of claim 10 wherein an impedance mismatch exists between said impulse generator and said transmission line.
13. The resonant driving circuit of claim 10 wherein an impedance mismatch exists between said laser diode and said transmission line.
14. The resonant driving circuit of claim 11 wherein said variable length is adjusted to cause said electrical pulses reflected between said laser diode and said impulse generator to constructively interfere with said electrical pulses output from said impulse generator.
15. The resonant driving circuit of claim 1 further comprising an optical device coupled to said laser diode.
16. The resonant driving circuit of claim 15 wherein said optical device is at least one of an optical focusing system, an optical communications system, an optoelectronic sampling circuit, an optoelectronic logic clocking circuit, an optoelectronic multiplexer, a photonic switch, an optical fiber, and an optoelectronic coupler.

17. A resonant driving circuit for a laser diode comprising:

an impulse generator for generating electrical pulses;

a delay line coupled to said impulse generator for increasing peak power of said electrical pulses;

a laser diode coupled in series with said delay line for producing optical pulses in response to said electrical pulses;

a forward bias network coupled to said laser diode; and an optical device coupled to said laser diode, wherein said optical device is at least one of an optical focusing system, an optical communications system, an optoelectronic sampling circuit, an optoelectronic logic clocking circuit, an optoelectronic multiplexer, a photonic switch, an optical fiber, and an optoelectronic coupler.

* * * * *

UNITED STATES PATENT AND TRADEMARK OFFICE
CERTIFICATE OF CORRECTION

PATENT NO. : 5,987,045
DATED : November 16, 1999
INVENTOR(S) : Donald J. Albares, Ching T. Chang, Chen-Kuo Sun and Everett W. Jacobs It is certified that error appears in the above-identified patent and that said Letters Patent is hereby corrected as shown below:

Column 4, line 6, should read as follows:

Claim 1 - a laser diode coupled in series [when] --with said-- delay line for producing optical pulses in response to said electrical pulses; and Signed and Sealed this Fifth Day of September, 2000

Attest:

Attesting Officer

Q. TODD DICKINSON
Director of Patents and Trademarks